United States Patent
Behringer et al.

(10) Patent No.: US 8,115,909 B2
(45) Date of Patent: Feb. 14, 2012

(54) SENSOR SYSTEM WITH A LIGHTING DEVICE AND A DETECTOR DEVICE

(75) Inventors: Martin Rudolf Behringer, Regensburg (DE); Joerg Heerlein, Sinzing (DE); Johann Luft, Wolfsegg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 208 days.

(21) Appl. No.: 12/393,147

(22) Filed: Feb. 26, 2009

(65) Prior Publication Data

US 2009/0244515 A1 Oct. 1, 2009

(30) Foreign Application Priority Data

Feb. 29, 2008 (DE) .......................... 10 2008 011 865
May 9, 2008 (DE) .......................... 10 2008 022 941

(51) Int. Cl.
*G01C 3/08* (2006.01)
(52) U.S. Cl. .......................................... 356/4.1; 356/3.1
(58) Field of Classification Search ................... 356/3.1, 356/4.01, 5.01, 5.11
See application file for complete search history.

(56) References Cited

U.S. PATENT DOCUMENTS

| | | |
|---|---|---|
| 4,996,430 A | 2/1991 | Gupta |
| 5,212,706 A | 5/1993 | Jain |
| 5,684,309 A | 11/1997 | McIntosh et al. |
| 5,831,277 A | 11/1998 | Razeghi |
| 6,172,382 B1 | 1/2001 | Nagahama et al. |
| 6,434,179 B1 | 8/2002 | Ebeling |
| 6,567,449 B1 * | 5/2003 | Ashida .......................... 372/50.1 |
| 6,849,881 B1 | 2/2005 | Harle et al. |
| 2007/0062092 A1 | 3/2007 | Roes |
| 2007/0181810 A1 | 8/2007 | Tan et al. |

FOREIGN PATENT DOCUMENTS

| | | |
|---|---|---|
| DE | 40 07 646 | 9/1991 |
| DE | 10 2004 014 041 | 10/2005 |
| DE | 10 2005 030 451 | 1/2007 |
| DE | 10 2005 055 272 | 5/2007 |
| DE | 10 2007 004 609 | 8/2007 |
| DE | 10 2007 032 997 | 1/2009 |
| DE | 10 2007 051 167 | 3/2009 |
| WO | WO 99/39405 | 8/1999 |
| WO | WO 01/39282 | 5/2001 |

* cited by examiner

*Primary Examiner* — Isam Alsomiri
(74) *Attorney, Agent, or Firm* — Fish & Richardson P.C.

(57) ABSTRACT

A sensor system with a lighting device and a detector device is specified. The lighting device is provided for emitting laser radiation of a first wavelength and laser radiation of a second wavelength different from the first. The detector device is provided for detecting electromagnetic radiation of the first and the second wavelength.

24 Claims, 1 Drawing Sheet

SENSOR SYSTEM WITH A LIGHTING DEVICE AND A DETECTOR DEVICE

CROSS REFERENCE TO RELATED APPLICATION

Under 35 U.S.C. §119, this application claims the benefit of foreign priority of German Patent Application 10 2008 011 865.6, filed Feb. 29, 2008, and German Patent Application 10 2008 022 941.5, filed May 9, 2008, the contents of which are hereby incorporated by reference in their entirety.

BACKGROUND

The present application is directed to a sensor system with a lighting device and a detector device.

It is an object of the present application to specify a sensor system that comprises a detector device and a lighting device and is particularly versatile.

SUMMARY

A sensor system with a lighting device and a detector device is specified. The lighting device is provided for emitting laser radiation of a first wavelength and laser radiation of a second wavelength different from the first. The detector device is provided for detecting electromagnetic radiation of the first and the second wavelength.

The phrase "laser radiation of a first wavelength" is understood herein to mean that the lighting device emits laser radiation that has an emission maximum at the first wavelength. The laser radiation is, in particular, narrow-band-emitted. For example, the laser radiation of the first wavelength includes substantially only laser radiation whose wavelength deviates from the first wavelength by 10 nm or less. The preceding statements apply mutatis mutandis to "laser radiation of a second wavelength."

The lighting device is provided in particular to emit electromagnetic (laser) radiation with a line spectrum having at least two emission lines. The line spectrum preferably has between two and ten emission lines, limits included. Otherwise expressed, the lighting device emits laser radiation having a plurality, particularly between two (inclusive) and ten (inclusive), of different wavelengths.

For example, during the operation of the sensor system, the lighting device illuminates an object. The object reflects a portion of the laser radiation emitted by the lighting device to the detector device, where the reflected laser radiation is detected. The greater the reflection coefficient of the object for the laser radiation emitted by the lighting device, the greater the magnitude of the signal received by the detector device. The reflection coefficient is normally wavelength-dependent, and this wavelength dependence depends on the material of the object. At a given wavelength, therefore, different materials will reflect a differently large portion of the laser radiation.

Through the use of the lighting device emitting laser radiation of not just one wavelength, but a plurality of different wavelengths, the number of materials for which a relatively large reception signal can be obtained in the detector device is increased in comparison to a lighting device having only one emitted wavelength. This reduces the risk that the detection of an object by the sensor system will be impaired due to the material of the object. The sensor system is thereby, for example, particularly versatile.

In one configuration of the sensor system, a difference between the first and the second wavelength is greater than or equal to 20 nm, particularly greater than or equal to 50 nm.

In one configuration, the lighting device is provided for emitting laser radiation of a first wavelength, laser radiation of a second wavelength different from the first, and laser radiation of at least one additional wavelength different from the first and from the second. The detector device is provided in this case for detecting electromagnetic radiation of the first, the second and the at least one additional wavelength. The lighting device can thus emit a plurality of laser radiations of different wavelengths that can be detected by the detector.

In another configuration, the lighting device contains at least one semiconductor laser diode. Semiconductor laser diodes normally have a high electro-optical efficiency and permit, in particular, a relatively high optical output power.

The semiconductor laser diode can in the present context be a laser diode chip or a laser diode component having a laser diode chip and a housing. The semiconductor laser diode comprises a semiconductor layer sequence with an active region provided for generating radiation. The active region is preferably preceded by a cladding layer and succeeded by another cladding layer. The cladding layers are, for example, provided for effecting charge carrier confinement. The semiconductor laser diode also comprises a resonator.

In one configuration, the semiconductor layer sequence is based on a semiconductor material selected from the following group: gallium phosphide (GaP), gallium arsenide (GaAs), aluminum gallium arsenide (AlGaAs), indium gallium phosphide (InGaP), indium aluminum gallium phosphide (InAlGaP), gallium indium arsenide antimonide (GaInAsSb), aluminum gallium arsenide antimonide (AlGaAsSb), indium gallium arsenide phosphide (InGaAsP). A semiconductor layer sequence based on one of these semiconductor materials has at least one layer—the active region, for example—that contains the semiconductor material. The semiconductor laser diode can also have a substrate on which the semiconductor layer sequence is disposed, and which, in particular, is epitaxially grown. In one configuration, the substrate comprises gallium antimonide (GaSb) or gallium arsenide (GaAs).

To generate radiation, the active region preferably contains a pn junction, a double heterostructure, a single quantum well (SQW) or, particularly preferably, a multi-quantum-well (MQW) structure. The term "quantum well structure" herein carries no implication as to the dimensionality of the quantization. It therefore includes, among other things, quantum troughs, quantum wires and quantum dots and any combination of these structures. Examples of MQW structures are described in the documents WO 01/39282, U.S. Pat. No. 5,831,277, U.S. Pat. No. 6,172,382 B1 and U.S. Pat. No. 5,684,309, whose disclosure content on this subject is hereby incorporated by reference.

For example, in the case of an edge-emitting laser diode, according to one configuration the active region is disposed between two waveguide layers of the semiconductor layer sequence, which in turn are disposed between the two cladding layers. The refractive index of the waveguide layers usefully differs from that of the cladding layers, with the result that the electromagnetic radiation emitted by the active region is guided between the two cladding layers. The resonator of an edge-emitting laser diode can, for example, be formed by the flanks of the semiconductor layer sequence.

Alternatively, the laser diode can also be a surface-emitting semiconductor laser, for example a VCSEL (Vertical Cavity Surface Emitting Laser) or a VECSEL (Vertical External Cavity Surface Emitting Laser).

In a surface-emitting semiconductor laser, the emission of the laser radiation takes place, not from a flank of the semiconductor layer sequence, as in the case of an edge-emitting laser, but in a direction that extends at an angle—particularly perpendicularly—to a main plane of extension of the semiconductor layer sequence. The main plane of extension is understood in the present case to be that plane whose surface normal represents the direction in which the layers of the semiconductor layer stack succeed one another. In particular, the main plane of extension thus is perpendicular to the growth direction of the semiconductor layer stack.

A VCSEL herein is a surface-emitting semiconductor laser in which the resonator is, in particular, integrated into the semiconductor layer sequence. In a VECSEL, the resonator usually has at least one external mirror.

In one configuration, the surface-emitting semiconductor laser contains an additional edge-emitting laser structure for pumping the surface-emitting semiconductor layer sequence. The edge-emitting laser structure can be configured as monolithically integrated with the surface-emitting semiconductor layer sequence.

In one embodiment, the lighting device contains at least one first semiconductor laser diode which in operation emits laser radiation of the first wavelength and at least one second semiconductor laser diode which in operation emits laser radiation of the second wavelength. In one configuration, the first and the second semiconductor laser diode or the first semiconductor laser diodes and/or the second semiconductor laser diodes are configured as monolithically integrated, particularly as laser bars.

In another embodiment, the lighting device contains a semiconductor laser diode that has a first active region and a second active region. The first and second active regions are both contained in the semiconductor layer sequence of the semiconductor laser diode, that is, they are configured as monolithically integrated. They are preferably stacked one on top of the other. The lighting device can also contain a plurality of such semiconductor laser diodes, which in a development of the invention are implemented as laterally adjacent in a monolithically integrated manner. The semiconductor laser diodes then particularly form a laser bar, commonly also referred to as an array.

The semiconductor layer sequence particularly contains a tunnel diode between the first and second active regions. The two active regions are particularly connected electrically in series by the tunnel diode. In one configuration, the laser diode is edge-emitting.

Such a semiconductor laser diode is known in principle from, for example, the document WO 99/39405. In addition, the document U.S. Pat. No. 5,212,706 describes an edge-emitting semiconductor laser diode in which plural active regions are deposited monolithically one on top of the other and the laser diodes are connected to one another by means of tunnel diodes.

In the present case, the first active region emits laser radiation of the first wavelength when the semiconductor laser diode is operating and the second active region emits radiation of the second wavelength when the semiconductor laser diode is operating. At least one of the active regions disposed one above the other within a layer stack therefore emits laser radiation of a wavelength $\lambda 1$ and at least one other active region emits laser radiation of a wavelength $\lambda 2$, where $\lambda 1 \neq \lambda 2$.

The tunnel diode is formed, for example, by a highly n-doped layer and a highly p-doped layer. The highly doped layers need not necessarily be uniformly doped in this case, since the mere presence of high doping on the side facing the respective other highly doped layer may be sufficient to create a tunnel junction. In a development of the invention, an interlayer is provided between the two highly doped layers. The interlayer can be undoped, n-doped or p-doped. However, the interlayer preferably has a lower dopant concentration than one or both of the highly doped layers.

In one configuration, the first and second active regions each have a quantum well structure. In a development for obtaining the different emission wavelengths, the quantum well structure associated with the first active region and the quantum well structure associated with the second active region differ in their layer thicknesses and/or their material composition. Alternatively or additionally, it is also possible for the dimension of the quantization of the charge carriers to differ between the quantum well structure of the first active region and the quantum well structure of the second active region. For example, one of the active regions can comprise quantum dots or quantum wires, while the other active region comprises quantum troughs.

The number of active regions in the semiconductor laser diode is preferably between two (inclusive) and ten (inclusive). It is, for example, possible for the semiconductor laser diode to have three or more active regions, each emitting laser radiation of a different wavelength. It is also possible for more than one of the active regions of the semiconductor laser diode to emit laser radiation of the first wavelength in order to obtain the highest possible output at that wavelength. In that case, the semiconductor laser diode contains at least one additional active region that emits at the second wavelength.

A resonator length of the semiconductor laser diode is preferably between 0.3 mm and 10 mm. The resonator length is defined, for example, by the distance of the lateral flanks forming the resonator from the edge-emitting semiconductor laser diode.

The semiconductor laser diode can be implemented, for example, as a broad-area laser diode or as a trapezoidal laser. A particularly high radiant power of the emitted radiation can advantageously be obtained with such a laser diode. The active region of a broad-area laser diode has, for example, a lateral extent greater than or equal to 50 μm, preferably greater than or equal to 100 μm. In the case of a trapezoidal laser, particularly the lateral extent of the active region increases, at least over a portion of the resonator length, in the direction from one resonator mirror to the second resonator mirror. In this portion of the resonator length, the active region particularly has a trapezoidal contour in plan. The contour and/or the lateral extent of the active region is determined, for example, by the shape of an electrode and/or by the shape of the semiconductor layer sequence, particularly by a structuring of the semiconductor layer sequence.

Especially good beam quality is obtained with an index-guided ridge waveguide. To this end, at least a portion of the layer stack, i.e. of the semiconductor layer sequence, is structured in the form of narrow webs that create the index-guided ridge waveguide.

A further improvement in beam quality can be obtained if the layer stack includes at least one shutter layer. The shutter layer has a strip-shaped opening that runs the length of the web and is surrounded laterally by an insulating region of the shutter layer. The strip-shaped opening has, for example, a width of 1-10 μm, typically 2-6 μm, limits included in each case. A narrow structure of this kind defines a waveguide for the laser radiation which in particular makes it possible to form solely the basic mode.

In a simple method for making such a shutter, it can be produced as a so-called oxide shutter in an oxidation process. For this purpose, for example a layer stack whose active region has a quantum well structure is made to contain a shutter layer whose material can be oxidized into an electrical insulator. The shutter layer is advantageously disposed a sufficient distance from the quantum well structure. After the layer stack has been structured into narrow webs, typically 20-30 μm wide, the shutter layers can then be progressively oxidized in the lateral direction, starting from their abutting edges with the web side walls or with the trench walls between two webs. This produces a shutter with an opening that becomes progressively smaller from the outside in.

The oxidizing conditions are maintained until the strip-shaped shutter opening has reached a suitable value which makes it possible to form solely the basic mode in a narrowed waveguide of this kind. A suitable width is, for example, between 1 and 10 μm, typically 2-6 μm, limits included in each case. Suitable candidates for use as the oxidizable material are, for example, aluminum-containing shutter layers.

A lighting device that contains a semiconductor laser diode having active regions that are stacked monolithically on top of one another can be made to have a particularly small overall size. At the same time, the lighting device can be made to have a particularly high optical output power, for example greater than or equal to 1 W, preferably greater than or equal to 10 W.

In one configuration of the sensor system utilizing a plurality of different wavelengths, a difference between the first and the second wavelength, particularly between the smallest and the largest of the wavelengths, is 200 nm or less.

In another configuration, the lighting device is provided for emitting laser radiation in the infrared spectral region. In particular, the first and/or the second wavelength is in the infrared spectral region.

For example, at least one of the active regions can contain AlGaInAs, i.e., $Al_nGa_mIn_{1-n-m}As$, where $0 \leq n \leq 1$, $0 \leq m \leq 1$ and $n+m \leq 1$. This material system, for example, permits emission wavelengths of, e.g., 780-1100 nm, limits included. In a development, the first and/or the second wavelength has a value between 800 nm (inclusive) and 1000 nm (inclusive).

In one configuration, the sensor system is provided for measuring a distance and/or a speed. For example, in this configuration the detector device contains a single-channel sensor such as a photodiode. The sensor system is, for example, contained in a collision warning system, particularly a collision warning system for motor vehicles.

In another configuration, the sensor system is contained in a night vision apparatus. In this configuration, the detector device of the sensor system contains, for example, a multi-channel sensor, for instance a semiconductor image sensor and/or a low-light amplifier. The lighting device emitting laser radiation having a plurality of different wavelengths makes it possible to obtain particularly high contrast in the image displayed by the night vision apparatus.

Further advantages and advantageous configurations will emerge from the following exemplary embodiment described in conjunction with the figures.

Figure 1:
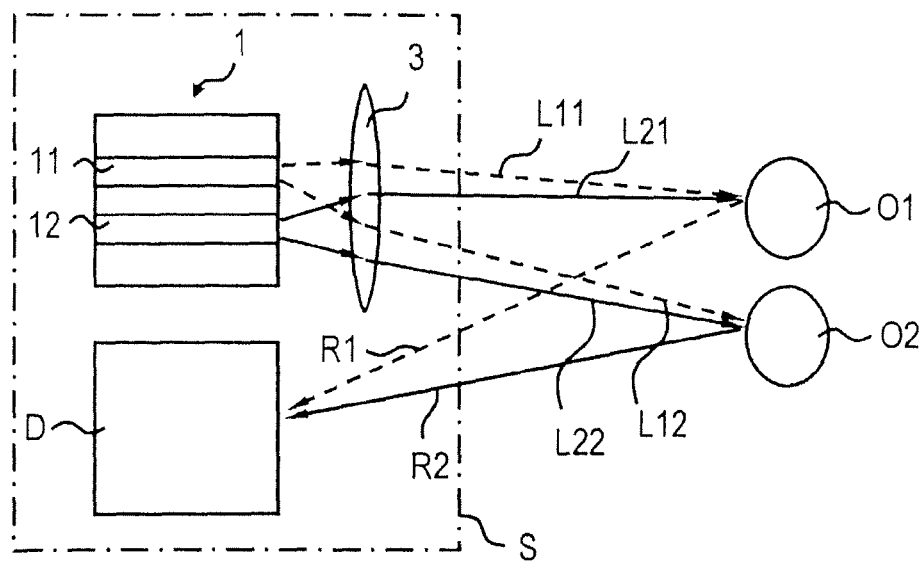
FIG. 1 is a schematic cross section through a sensor system according to an exemplary embodiment and FIG. 2 is a schematic perspective view of a semiconductor laser diode of the sensor system according to the exemplary embodiment of FIG. 1.

In the exemplary embodiments and figures, like or like-acting elements are provided with the same respective reference characters. The figures and the size relationships to one another of the elements depicted in the figures are not to be considered true to scale. Rather, individual elements may be depicted as exaggeratedly large for the sake of better understanding and/or greater ease of representation.

DETAILED DESCRIPTION

FIG. 1 shows an exemplary embodiment of a sensor system S. The sensor system S contains a lighting device. The lighting device in the present case contains a semiconductor laser diode 1 and an optical element 3 or an optical system 3 comprising a plurality of optical elements.

The semiconductor laser diode 1, which is illustrated in greatly simplified fashion in FIG. 1, has a first active region 11 and a second active region 12. The first active region 11 emits laser radiation L11, L12 of a first wavelength $\lambda 1$ when the semiconductor laser diode 1 is operating. The second active region 12 emits laser radiation L21, L22 of a second wavelength $\lambda 2$ when the semiconductor laser diode 1 is operating.

The semiconductor laser diode 1 can preferably comprise a plurality of active regions (not shown), in which case the active regions respectively emit laser radiation of different wavelengths when the semiconductor laser diode 1 is operating.

The optical element or optical system 3 is provided to shape the laser radiation L11, L12, L21, L22 emitted by the active regions 11, 12. For example, the optical element or system 3 is provided for effecting beam widening, beam deflection and/or beam focusing. The optical element or at least one of the optical elements of the optical system can be, for example, a lens, a diffraction grating, a mirror and/or a waveguide. Such an optical element or system is also suitable for other configurations of the sensor system S.

The sensor system S further comprises a detector device D. The detector device D is provided for detecting electromagnetic radiation of the first wavelength $\lambda 1$ and electromagnetic radiation of the second wavelength $\lambda 2$.

The detector device D contains a single-channel sensor, such as a photodiode, or a multi-channel sensor, for instance a semiconductor image sensor (CCD, Charge Coupled Device) and/or a low-light amplifier. For example, the sensor system S is a night vision apparatus and the detector device D contains a multi-channel sensor.

When the sensor system S is operating, the lighting device illuminates a solid angle region of the environment. If an object O1, O2 happens to be in the illuminated solid angle region, it is struck particularly by laser radiation L11 or L12 of the first wavelength $\lambda 1$ and by laser radiation L21 or L22 of the second wavelength $\lambda 2$.

The reflection coefficient at the wavelengths $\lambda 1$ and $\lambda 2$ is dependent on the illuminated material of the object O1, O2. For example, a first object O1 has a comparatively high reflection coefficient at the first wavelength $\lambda 1$ and a comparatively low reflection coefficient at the second wavelength $\lambda 2$. A second object O2 has a comparatively high reflection coefficient at the second wavelength $\lambda 2$ and a comparatively low reflection coefficient at the first wavelength $\lambda 1$.

The first object O1 thus reflects essentially laser radiation L11 of the first wavelength $\lambda 1$, with the result that a reflected portion R1 of this laser radiation emitted by the first active region 11 reaches the detector device D. The second object O2 reflects essentially laser radiation L22 of the second wavelength $\lambda 2$, with the result that a reflected portion R2 of this laser radiation emitted by the second active region 12 also reaches the detector device D.

Conversely, the first object O1 reflects the laser radiation L21 emitted by the second active region 12 only slightly or not at all and/or the second object O2 reflects the laser radiation L12 emitted by the first active region 11 only slightly or not at all.

In this way, sensor system S—in contrast to a sensor system that works with only one of the wavelengths λ1 or λ2—is advantageously suitable for detecting both the first object O1 and the second object O2. For example, in the case of a sensor system that is a night vision apparatus, both objects O1, O2 can be imaged with high contrast to background.

Figure 2:
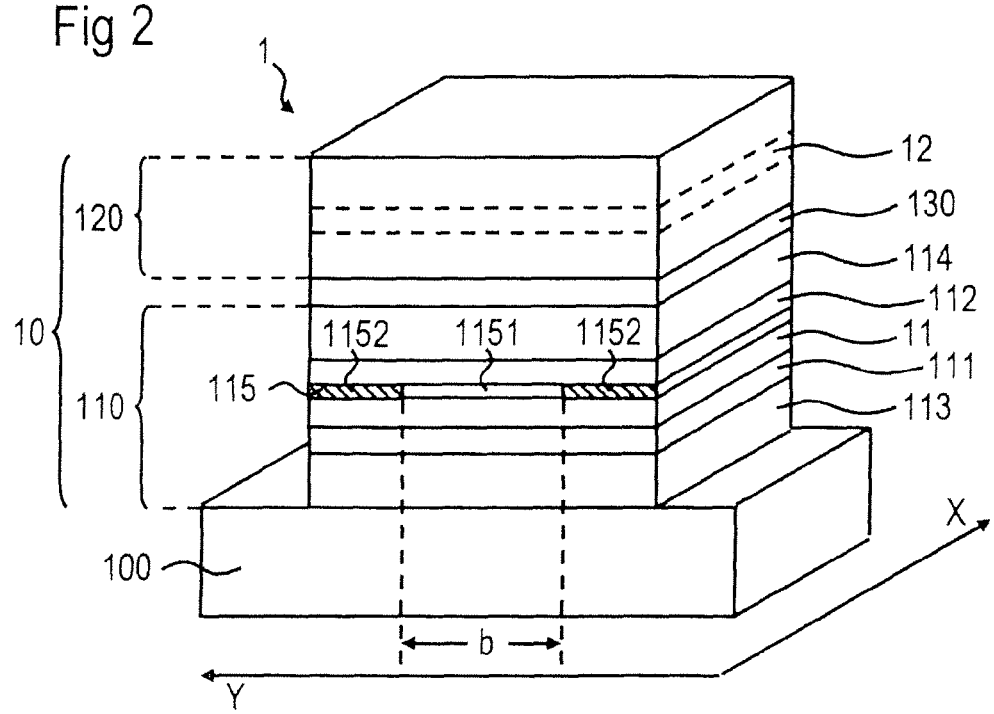

FIG. 2 is a schematic perspective view of the semiconductor laser diode 1 of the sensor system S according to the exemplary embodiment of FIG. 1.

The semiconductor laser diode 1 contains a semiconductor layer sequence 10 that is grown epitaxially on a substrate 100. The semiconductor laser sequence 10 is preferably based on a III-V compound semiconductor material, particularly on an arsenide, nitride or phosphide compound semiconductor material.

For example, the semiconductor layer sequence 10 can contain $In_xAl_yGa_{1-x-y}N$, $In_xAl_yGa_{1-x-y}P$ or $In_xAl_yGa_{1-x-y}As$, where in each case $0 \leq x \leq 1$, $0 \leq y \leq 1$ and $x+y \leq 1$. The composition of the III-V compound semiconductor material in question need not necessarily be mathematically exactly that of the above formula. Rather, said material can contain one or more dopants and additional constituents that do not substantially alter the physical properties of the material. For the sake of simplicity, however, the above formula includes only the essential components of the crystal lattice, even though these may be partially replaced by very small quantities of other substances.

The choice of material for the semiconductor layer sequence 10 is based on the desired emission wavelengths of the semiconductor laser diode 1. The substrate 100 is chosen according to the semiconductor layer sequence 10 used, which is preferably to be grown epitaxially, and can in particular be a GaAs, GaN, SiC or silicon substrate.

The semiconductor layer sequence 10 comprises a first diode laser layer system 110 that contains the first active region 11. It has a second diode laser layer system 120 that contains the second active region 12.

Unlike the first diode laser layer system 110, the second diode laser layer system 120 is only roughly indicated in FIG. 2. The second diode laser layer system 120 is, for example, constructed analogously to the first diode laser layer system 110. To obtain the different emission wavelengths λ1 and λ2, however, the active regions 11, 12 differ in their material and/or their layer thicknesses and/or in the dimension of quantization.

The first and second diode laser layer systems 110, 120—and thus the first and second active regions 11, 12—succeed one another in the direction of a surface normal to the main plane of extension of the substrate 100. In FIG. 2, the surface normal coincides with the z-direction (not shown) of the right-angled Cartesian coordinate system whose x- and y-directions are illustrated in FIG. 2.

A tunnel diode 130 is disposed between the two diode laser layer systems 110, 120. In the present case, said tunnel diode contains—for example, in the direction proceeding from first active region 11 to second active region 12—a highly p-doped layer, an undoped or minimally doped interlayer and a highly n-doped layer.

The first diode laser layer system 110 contains the first active region 11, which in this case is a multi-quantum-well structure. Configuring the active regions 11, 12 as quantum well structures results in a laser threshold that is relatively low compared to a semiconductor laser with a conventional pn junction as its active region. The temperature dependence of the emission wavelengths λ1, λ2 is also advantageously low in this case.

Proceeding away from active region 11, first diode laser layer system 110 comprises, both in the direction toward the substrate 100 and in the direction toward second active region 12, respectively a waveguide layer 111, 112 and a cladding layer 113, 114. By means of the waveguide layers 111, 112, the electromagnetic radiation emitted by the active region 11 is guided between the cladding layers 113, 114. The cladding layer 113 facing the substrate 100 is n-conductively doped in the present case. Layer growth in the reverse order, i.e., with a p-conductive cladding layer 113 facing the substrate 100, may also be contemplated.

The laser resonator of the semiconductor laser diode 1 is formed, for example, by the lateral flanks of the semiconductor layer sequence 10. At least partial reflection of the laser radiation generated in the active regions 11, 12 from the lateral flanks takes place, for example, because of the refractive index mismatch between the material of the semiconductor layer sequence 10 and the environmental medium (air, for example). Alternatively, the lateral flanks of the semiconductor laser diode 1 can also be provided with a reflection-enhancing coating (not shown). In a preferred configuration, the length L of the laser resonator is between 0.3 mm (inclusive) and 10 mm (inclusive).

In the present case, a shutter layer 115 is configured between active region 11 and one of the cladding layers 114. Alternatively, the shutter layer 115 can also be disposed at the edge or in the interior of waveguide layer 111, 112 or cladding layer 113, 114. The shutter layer is, for example, an aluminum-containing layer, particularly containing or consisting of AlAs or GaAlAs. Shutter layer 115 has an electrically conductive or at least semiconductive middle region 1151, which constitutes a strip-shaped opening between two insulating marginal regions 1152.

The insulating marginal regions 1152 are produced, for example, via an oxidation process. The abutting edges of shutter layer 10 that are exposed in the trenches can be transformed into an electrical insulator by oxidation, e.g. by adjusting oxidizing conditions by means of an oxygen-containing atmosphere at sufficiently high temperature, or by wet chemical treatment with an oxidizing solution, as already illustrated in FIG. 2.

By means of this shutter, the intensity distribution of the laser radiation is substantially limited to the shutter region, that is, a waveguide is created that has approximately the width b of the shutter opening and makes it possible to form the laser radiation solely in basic mode.

To produce an index-guided laser structure, the semiconductor layer sequence 10 is structured into at least one narrow web. The web has its longest extent, which corresponds in particular to the resonator length of the semiconductor laser diode 1, in the x-direction. For example, the resonator length has a value of between 0.3 mm and 10 mm, limits included.

In the present case, the strip-shaped opening 1151 of the shutter layer 115 also extends along the web, i.e., in the x-direction. The width b of the strip-shaped opening in the y-direction, i.e., in the direction of the web width, is, for example, between 6 µm and 12 µm. The width of the web, i.e., its extent in the y-direction, is between 20 µm and 30 µm. The limits of the ranges are included in each case.

The invention is not limited by the description made with reference to the exemplary embodiments. For example, the semiconductor laser diode 1 can be implemented as a broad-area laser. In that case, it has, in particular, no shutter layer 115. It also does not need to have an index-guided laser structure, but can be configured for example as gain-guided. In a semiconductor laser diode 1 that is implemented as a broad-area laser and has an index-guided laser structure, the width of the web is, for example, greater than or equal to 50 µm, particularly greater than or equal to 100 µm.

The invention encompasses any novel feature and any combination of features, including in particular any combination of features recited in the claims, even if that feature or combination itself is not explicitly mentioned in the claims or exemplary embodiments.

What is claimed is:

1. A sensor system comprising a lighting device and a detector device, wherein said lighting device is provided for emitting laser radiation of a first wavelength and laser radiation of a second wavelength different from the first, and said detector device is provided for detecting electromagnetic radiation of said first and said second wavelength
    wherein the lighting device comprises a semiconductor laser diode
    wherein said semiconductor laser diode has a first active region and a second active region,
    wherein said first and second active regions are contained in a semiconductor layer sequence of said semiconductor laser diode and are stacked one on top of the other,
    wherein said first active region emits laser radiation of said first wavelength and said second active region emits laser radiation of said second wavelength when said semiconductor laser diode is operating, and
    wherein each of said first and said second active regions has a quantum well structure and said quantum well structures differ in their layer thicknesses and/or in the dimension of quantization for obtaining the different emission wavelengths.

2. The sensor system as in claim 1, wherein the lighting device comprises a first semiconductor laser diode emitting in operation laser radiation of said first wavelength, and a second semiconductor laser diode emitting in operation laser radiation of said second wavelength.

3. The sensor system as in claim 1, wherein said semiconductor layer sequence contains a tunnel diode between said first and said second active region.

4. The sensor system as in claim 3, wherein each of said first and second active regions has a quantum well structure and said quantum well structures differ in their material composition.

5. The sensor system as in claim 1, wherein each of said first and second active regions has a quantum well structure and said quantum well structures differ in their material composition.

6. The sensor system as in claim 1, wherein said lighting device is provided for emitting laser radiation in the infrared spectral region.

7. The sensor system as in claim 6, wherein said first and/or said second wavelength has a value between 800 nm (inclusive) and 1000 nm (inclusive).

8. The sensor system as in claim 1, wherein a difference between said first and said second wavelength is greater than or equal to 20 nm.

9. The sensor system as in claim 1, which is provided for measuring a distance and/or a speed.

10. A collision warning system comprising a sensor system according to claim 1.

11. A night vision apparatus comprising a sensor system according to claim 1.

12. The night vision apparatus as in claim 11, wherein the detector device comprises a semiconductor image sensor or a low-light amplifier.

13. The sensor system as in claim 1, wherein one of the first and second active regions comprises quantum dots or quantum wires and the other one of the first and second active regions comprises quantum troughs.

14. The sensor system as in claim 1, wherein the semiconductor layer sequence is structured in the form of a web such that an index-guided ridge is created.

15. A sensor system comprising a lighting device and a detector device, wherein said lighting device is provided for emitting laser radiation of a first wavelength and laser radiation of a second wavelength different from the first, and said detector device is provided for detecting electromagnetic radiation of said first and said second wavelength
    wherein the lighting device comprises a semiconductor laser diode
    wherein said semiconductor laser diode has a first active region and a second active region,
    wherein said first and second active regions are contained in a semiconductor layer sequence of said semiconductor laser diode and are stacked one on top of the other,
    wherein said first active region emits laser radiation of said first wavelength and said second active region emits laser radiation of said second wavelength when said semiconductor laser diode is operating,
    wherein each of said first and said second active regions has a quantum well structure and said quantum well structures differ in their layer thicknesses and/or in the dimension of quantization, and
    wherein the semiconductor laser diode has three or more active regions and a plurality of the active regions emit laser radiation of the first wavelength.

16. The sensor system as in claim 15, wherein said lighting device is provided for emitting laser radiation in the infrared spectral region.

17. The sensor system as in claim 16, wherein said first and/or said second wavelength has a value between 800 nm (inclusive) and 1000 nm (inclusive).

18. The sensor system as in claim 15, wherein a difference between said first and said second wavelength is greater than or equal to 20 nm.

19. The sensor system as in claim 15, which is provided for measuring a distance and/or a speed.

20. A collision warning system comprising a sensor system according to claim 15.

21. A night vision apparatus comprising a sensor system according to claim 15.

22. The night vision apparatus as in claim 21, wherein the detector device comprises a semiconductor image sensor or a low-light amplifier.

23. A sensor system comprising a lighting device and a detector device, wherein said lighting device is provided for emitting laser radiation of a first wavelength and laser radiation of a second wavelength different from the first, and said detector device is provided for detecting electromagnetic radiation of said first and said second wavelength
    wherein the lighting device comprises a semiconductor laser diode
    wherein said semiconductor laser diode has a first active region and a second active region,
    wherein said first and second active regions are contained in a semiconductor layer sequence of said semiconductor laser diode and are stacked one on top of the other,
    wherein said first active region emits laser radiation of said first wavelength and said second active region emits laser radiation of said second wavelength when said semiconductor laser diode is operating, wherein each of said first and said second active regions has a quantum well structure and said quantum well structures differ in their layer thicknesses and/or in the dimension of quantization, wherein the semiconductor layer sequence is structured in the form of a web such that an index-guided ridge is created, and wherein the semiconductor layer sequence comprises a shutter layer having a strip-shaped opening that runs the length of the web and is surrounded laterally by an insulating region.

24. The sensor system as in claim 23, wherein the strip-shaped opening has a width of 1-10 μm.

* * * * *

UNITED STATES PATENT AND TRADEMARK OFFICE
CERTIFICATE OF CORRECTION

PATENT NO. : 8,115,909 B2
APPLICATION NO. : 12/393147
DATED : February 14, 2012
INVENTOR(S) : Martin Rudolf Behringer, Joerg Heerlein and Johann Luft It is certified that error appears in the above-identified patent and that said Letters Patent is hereby corrected as shown below:

Cover page, References Cited item (56), Foreign Patent Documents, column 2, line 16, delete "DE 10 2005 055 272" and insert -- DE 10 2005 055 572 --.

Signed and Sealed this
First Day of May, 2012

David J. Kappos
*Director of the United States Patent and Trademark Office*